United States Patent

Chao

[11] Patent Number: 5,095,404
[45] Date of Patent: Mar. 10, 1992

[54] ARRANGEMENT FOR MOUNTING AND COOLING HIGH DENSITY TAB IC CHIPS

[75] Inventor: Shun-Lung Chao, Westboro, Mass.

[73] Assignee: Data General Corporation, Westboro, Mass.

[21] Appl. No.: 484,555

[22] Filed: Feb. 26, 1990

[51] Int. Cl.$^5$ .................................. H05K 7/20
[52] U.S. Cl. ........................ 361/385; 165/80.4; 165/104.33; 174/15.2; 361/388; 361/400
[58] Field of Search ............. 361/382, 383, 385–388, 361/398, 400, 401, 405; 165/80.3, 80.4, 80.5, 104.26, 104.33, 185; 174/16.3, 15.2, 252; 357/81, 82

[56] References Cited

U.S. PATENT DOCUMENTS

| | | | |
|---|---|---|---|
| 2,862,158 | 11/1958 | Stelmak | 165/104.33 |
| 4,204,246 | 5/1980 | Arii | 361/385 |
| 4,394,530 | 7/1983 | Kaufman | 361/388 |
| 4,563,725 | 1/1986 | Kirby | 361/388 |
| 4,628,407 | 12/1986 | August | 361/386 |
| 4,731,693 | 3/1988 | Berg | 361/386 |
| 4,849,857 | 7/1989 | Butt | 361/388 |
| 4,860,165 | 8/1989 | Cassinelli | 165/80.4 |
| 4,966,226 | 10/1990 | Hamburgen | 361/385 |
| 4,982,311 | 1/1991 | Dehaine | 361/388 |

OTHER PUBLICATIONS

"Substrate—Cooling", IBM Tech Discl Bull Bakelaar, vol. 14, No. 9, Feb. 1972, pp. 2690.

*Primary Examiner*—Gerald P. Tolin
*Attorney, Agent, or Firm*—Irving M. Kriegsman

[57] ABSTRACT

A printed circuit board assembly includes a printed circuit board having a top side, a bottom side and a hole. A heat spreader which comprises a plate made of a material having high thermal conductivity is mounted on the bottom side of the printed circuit board. The plate includes a pedestal which extends up into the hole. A high density TAB IC chip is mounted on top of the pedestal and is electrically connected to pads on the top side of the printed circuit board. A heat pipe is mounted underneath the plate of the heat spreader through a mounting pad which is fixed to the heat pipe and which is made of a material having good thermal conductivity. In operation, heat generated by the chip during use is spread out by the heat spreader and then removed by the heat pipe.

11 Claims, 2 Drawing Sheets

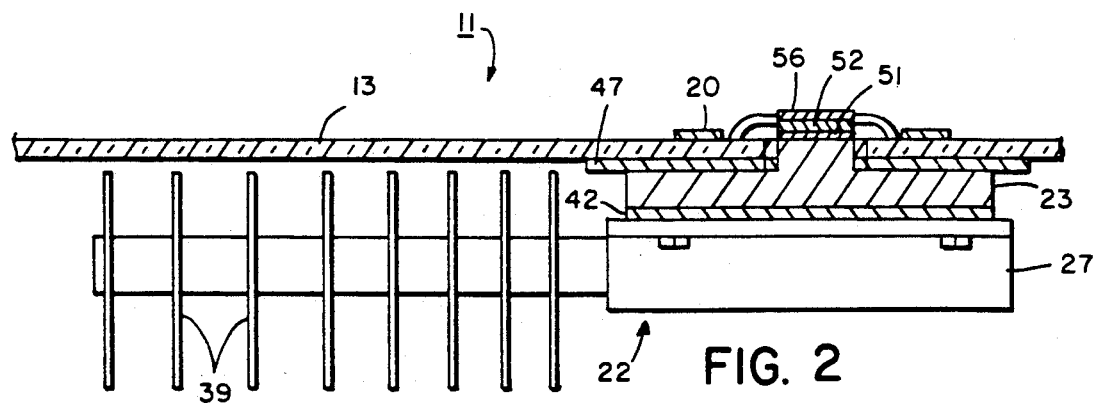
FIG. 2
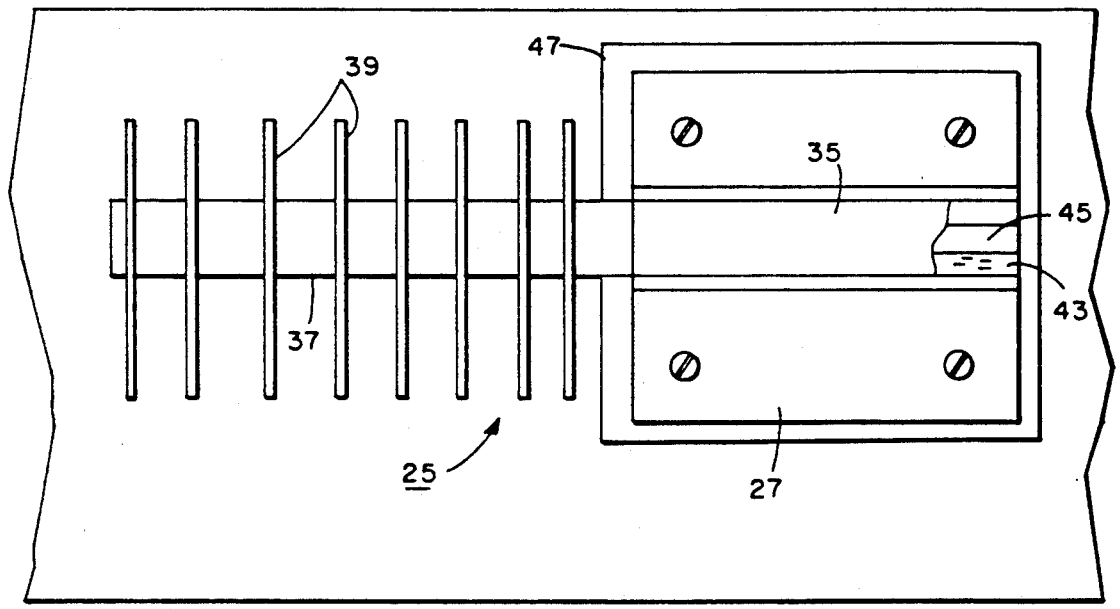
FIG. 4
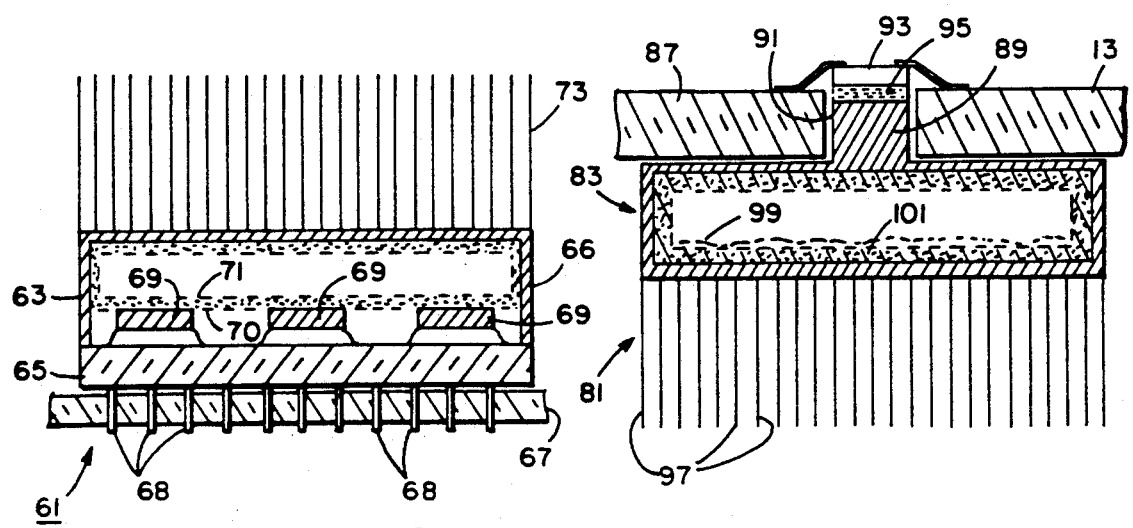
FIG. 6
FIG. 7

ARRANGEMENT FOR MOUNTING AND COOLING HIGH DENSITY TAB IC CHIPS

The present invention relates generally to integrated circuit (IC) chips and, more particularly, to an arrangement for mounting and cooling high density, tab automated bonding (TAB) IC chips.

IC chips are well known in the art and have been widely used in computer and other applications for well over fifteen years.

In the past, IC chips have either been mounted on ceramic substrates which have been attached by rigid leads to a printed circuit board or been mounted on surface-mountable chip carriers.

One way that has been employed in the past for cooling IC chips has been to blow air across them using either a fan or a blower. Another way that has been employed in the past for cooling IC chips has been to mount a small channel shaped or fin shaped heat sink on top of each chip. Still another way that has been employed in the past for cooling IC chips has involved immersing the printed circuit board containing the chips in a cooling liquid. These techniques have been used successfully for dissipating heat produced which has been in the order of up to about 10 to 15 watts.

As IC chip technology has advanced the density of the chips and the amount of heat produced by the chips during use has increased appreciably.

Recently a type of high density IC chip, employing tape automated bonding (TAB) interconnect technology has been developed. In a TAB high density IC chip the pads on the die are gang-bonded to the inner ends of a copper lead frame patterned on a polyimide carrier tape. A high density TAB IC chip can contain as many as 50,000 gates and between about 400-500 connecting leads, and can generate during use up to about 50 to 60 watts of heat. Typically, a high density TAB IC chip is sized on the order of about ¼ of an inch by ¼ of an inch. An article by Ashok Bindra describing high density TAB IC chips can be found in the March 1989 issue of High Performance Systems, pp. 46-50.

One of the problems with high density TAB IC chips is that the prior art techniques noted above for cooling chips are either inadequate or not usable. More specifically, the cooling produced by blowing air over the chips is not sufficient to efficiently remove the relatively large amount of heat produced by this relatively small sized chip and the construction of the high density TAB IC chip itself does not lead itself to physically mounting a heat sink on the top of the die, especially a heat sink of the size that would be necessary to handle the heat generated. Furthermore, because of a coating that is formed on the top surface of the chip, the transfer of heat from the chip to a heat sink on top of the chip would be very inefficient. On the other hand, immersing the printed circuit board in a cooling liquid is cumbersome and somewhat impractical.

As can be appreciated, in order to be usable and realize its full potential an arrangement is needed to effectively and efficiently remove the heat generated by a high density TAB IC chip during its operation.

Accordingly, it is an object of this invention to provide an arrangement for mounting a high density TAB IC chip on a printed circuit board.

It is another of this arrangement to provide an arrangement for cooling a high density TAB IC chip.

It is still another object of this invention to provide a new and improved printed circuit board assembly.

SUMMARY OF THE INVENTION

According to this invention, a heat pipe is used as a means for cooling a high density TAB IC chip.

A printed circuit board assembly constructed according to the teachings of the present invention comprises in one embodiment a printed circuit board having a top side, a bottom side and a hole, a heat spreader mounted on the bottom side of printed circuit board and having a pedestal which extends into the hole in the printed circuit board, a heat pipe underneath the printed circuit board and attached to the heat spreader and a high density TAB IC chip mounted on the top of the pedestal and electrically connected to pads on the top side of the printed circuit board, whereby, heat produced by the chip during use will be spread out by the heat spreader and then removed by the heat pipe. In another embodiment, a plurality of high density TAB IC chips are cooled by a single heat pipe and is still another embodiment a high density TAB IC chip as cooled by a heat pipe which is constructed to serve as a heat spreader.

Various features and embodiments will appear from the description to follow. In the description, reference is made to the accompanying drawings which forms a part thereof, and in which is shown by way of illustration, specific embodiments for practicing the invention. These embodiments will be described in sufficient detail to enable those skilled in the art to practice the invention, and it is to be understood that other embodiments may be utilized and that structural changes may be made without departing from the scope of the invention. The following detailed description is, therefore, not to be taken in a limiting sense, and the scope of the present invention is best defined by the appended claims.

BRIEF DESCRIPTION OF THE DRAWINGS

FIG. 2 is a front elevation view partly in section of the printed circuit board assembly shown in FIG. 1;

FIG. 4 is a fragmentary plan view taken from the bottom of the printed circuit board assembly shown in FIG. 1;

FIG. 6 is a side elevation view in section of another embodiment of the invention, and FIG. 7 is a side elevation view in section of still another embodiment of the invention.

DETAILED DESCRIPTION OF THE PREFERRED EMBODIMENT

The present invention is directed to an arrangement for mounting and cooling a high density TAB IC chip, especially a high power and high spreed emitter coupled logic (ECL) TAB IC chip.

Figure 1A:
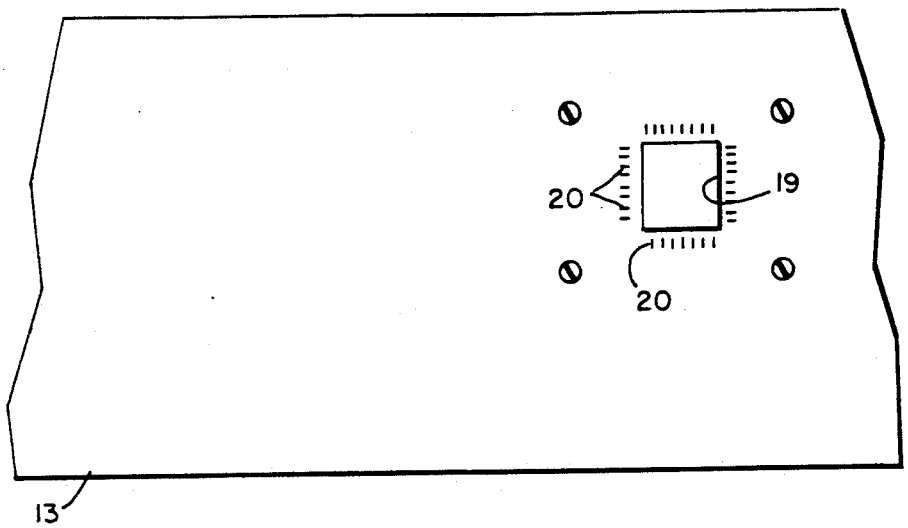
FIG. 1(a) is a fragmentary plan view from the top of the printed circuit board shown in FIG. 1.
Figure 1:
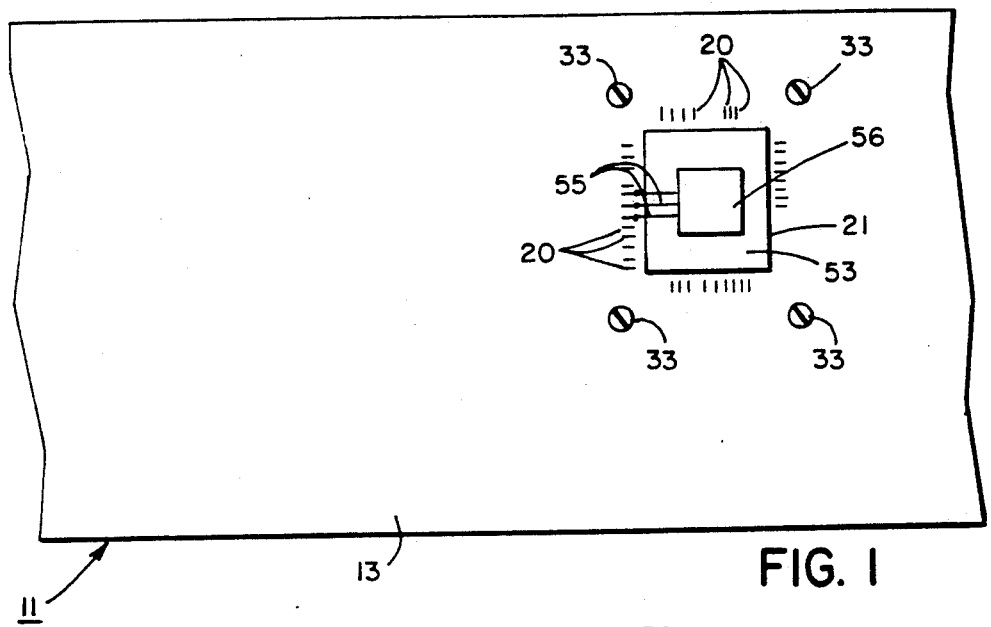
FIG. 1 is a fragmentary plan view taken from the top of a printed circuit board assembly constructed according to this invention.
Figure 3:
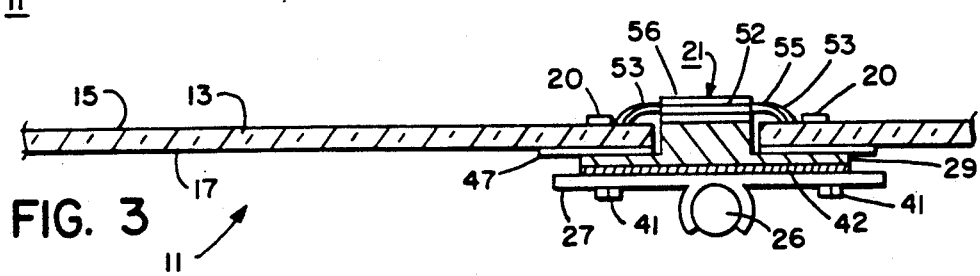
FIG. 3 is a side elevation view of the printed circuit board assembly shown in FIG. 1.
Figure 5:
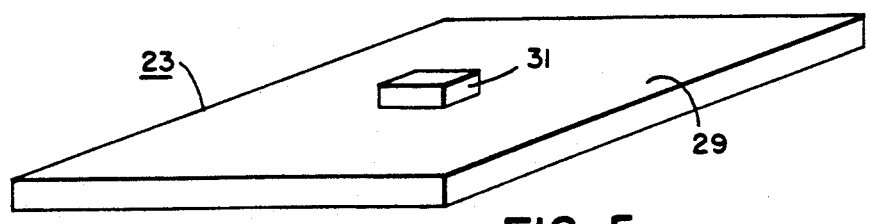
FIG. 5 is an enlarged perspective view taken from the top of the heat spreader in the printed circuit board assembly shown in FIG. 1.

Referring now to the drawings and first to FIGS. 1-5, there is shown a printed circuit board assembly constructed according to the teachings of the present invention and identified generally by reference numeral 11.

Printed circuit board assembly 11 includes a printed circuit board 13 having a top side 15 (on which components are to be mounted), a bottom side 17 and an hole (i.e. cutout) 19. Surrounding hole 19 are a plurality of pads 20. For simplicity only a few of the pads 20 are shown.

Printed circuit board assembly 11 further includes a high density TAB IC chip 21 and a heat sink assembly 22. Heat sink assembly 22 serves as a means for mounting chip 21 on printed circuit board 13 and as a means for cooling chip 21 and includes a heat spreader 23, a heat pipe 25 and a mounting pad 27.

Heat spreader 23 (see also FIG. 5) serves to spread out over a larger area the heat produced by chip 21. Heat spreader 23 is in the form of a rectangular plate having a base 29 and a pedestal 31 and is made out of a material having high thermal conductivity, such as a copper-tungsten alloy, aluminum nitride, beryllium oxide, aluminum or copper. Heat spreader 23 is mounted on the bottom side 17 of printed circuit board 13 by screws 33 with the pedestal 31 facing upward. Heat spreader 23 is disposed relative to board 13 such that pedestal 31 extends up into hole 19.

Heat pipe 25 serves to remove the heat received from heat spreader 23. Heat pipe 25 comprises a cylindrical structure 26 having a evaporator section 35 and a condenser section 37. The condenser section 37 is provided with fins 39. Mounting pad 27 serves to transfer the heat from heat spreader 23 to heat pipe 25. Mounting pad 27 surrounds evaporator section 35 of heat pipe 25 and is secured thereto by an adhesive having good thermal conductivity such as epoxy or solder. Mounting pad 27 is made of a material having good thermal conductivity, such as an aluminum extrusion or copper. Mounting pad 27 is attached to heat spreader 23 by screws 41. A layer 42 of thermally conductive material is disposed between heat spreader 23 and mounting pad 27. A working fluid 43 and a wick 45 are inside heat pipe 25. Working fluid 43 may for example, be water, methanol, ethanol or acetone. Wick 45 may, for example comprise a powder metal or a groove and screen structure.

A shim 47 comprising a sheet of a nonconductive material may be disposed between heat spreader 23 and printed circuit board 13 so that the top of pedestal 31 will be at the desired height relative to the top of side 15 of printed circuit board 13.

Chip 21 is fixedly mounted on top of pedestal 31 using a suitable die attach 51 such as epoxy. Chip 21 includes a die 52 which is surrounded by a film 53 under which are leads 55. For convenience only a few leads 55 are shown. An insulative coating (not shown) is formed underneath leads 55. An insulative layer 56 is formed on top of die 52 and serves as a protective coating for leads 55 and die 52.

In assembling assembly 11, heat spreader 23 is first attached to bottom side 17 of board 13. Then, chip 21 is mounted on top of pedestal 31. Then, mounting pad 27 (which is secured to heat pipe 25) is attached to heat spreader 23.

As can be appreciated, in addition to spreading out the heat, the pedestal 31 construction of heat spreader 23 enables chip 21 to be positioned above printed circuit board 13 and at the same time to be in contact with heat spreader 23 which is fixed to the bottom side of printed circuit board 13.

A bracket assembly or other suitable mechanical means (not shown) may be used to further secure heat pipe 25 to board 13.

During use, the heat generated from the chip 21 is primarily conducted from die attach 51 to pedestal 31 and distributed on heat spreader plate 29. The heat is then conducted through the interface and spread on heat sink mounting pad 27. The working fluid is vaporized inside the heat pipe and condensed on the inner surface of the condenser; and the condensate is returned to the evaporator by the wicking action. This close-loop cycle of passive operation will continue to transfer the heat as long as working mechanism of the heat pipe exists. The heat from chip 21 is ultimately dissipated from the finned surface into the cooling medium.

Instead of being separate elements, heat spreader 23 and mounting pad 27 may be a unitary structure. Also, pedestal 23 and heat spreader base plate 29 may be separate and dissimilar materials attached together so long as the thermal resistance is not significantly poorer than the integral piece. For example, a copper tungsten pedestal may be brazed to an aluminum-nitride plate.

Referring now to FIG. 6 there is shown another embodiment of the invention, identified by reference numeral 61.

In apparatus 61, a channel shaped module case 63 made of a material having good thermal conductivity, such as copper is attached to a substrate 65 to define a hermetically sealed chamber of a rectangular heat pipe 66. Heat pipe 66 is mounted on a board 67 by legs 68. Inside heat pipe 66 is a plurality of high density TAB IC chips 69. The chips 69 are attached to substrate 65 and in contact with a rectangular shaped wick 70. An electrically nonconductive heat transfer fluid 71 such as Fluorinent Electronic Liquid made by 3M is disposed inside heat pipe 66. A plurality of fins 73 are attached to the outside of case 63.

Referring now to FIG. 7, there is shown another embodiment of the invention, identified by reference numeral 81.

In apparatus 81 a rectangular shaped heat pipe 83 is mounted by screws 85 on the bottom side of a printed circuit board 87. Heat pipe 83 includes a pedestal 89 which extends up into an opening 91 in board 87. A high density TAB IC chip 93 is mounted by a die attach 95 on pedestal 89. A plurality of fins 97 extend down from the bottom of heat pipe 83. A wick 99 and a heat transfer fluid 101 are located inside heat pipe 83.

Although this invention has been described with reference to a particular embodiments, it should be understood that this invention is also capable of further embodiments within the spirit and scope of the appended claims.

What is claimed is:

1. A printed circuit board assembly comprising:
   a. a printed circuit board having a top side, a bottom side and a hole,
   b. a heat sink assembly, said heat sink assembly including a heat pipe, a mounting pad of thermally conductive material and a heat spreader of thermally conductive material, said heat spreader being mounted on the bottom side of said printed circuit board and comprising a plate having a base and a pedestal, said pedestal extending up into said hole in said printed circuit board, said heat pipe including an evaporator section and a condenser section, said evaporator section having an elongated pipe, said mounting pad extending around and being secured to said elongated pipe and being mounted on said heat spreader, and c. an IC chip mounted on top of said pedestal, d. whereby, heat produced by said IC chip during use will be spread out by said heat spreader, transferred by said mounting pad to said heat pipe and then removed by said heat pipe.

2. The printed circuit board assembly as defined in claim 1, wherein said IC chip is a high density IC chip.

3. The printed circuit board assembly of claim 2, wherein said high density IC chip is a high density TAB IC chip.

4. The printed circuit board assembly of claim 1, wherein said high density TAB IC chip is disposed above said top side of printed circuit board.

5. The printed circuit board assembly of claim 4, wherein said high density TAB IC chip is attached to said pedestal by a die attach material, said die attach material being capable of compensating for the mismatch of thermal coefficients of expansion between said chip and said pedestal.

6. The printed circuit board assembly as defined in claim 5, wherein said mounting pad is attached to said evaporator section of said heat pipe by a thermally conductive adhesive.

7. The printed circuit board assembly as defined in claim 6, wherein said heat spreader is attached to the bottom said of said printed circuit board by mounting screws and said mounting pad is attached to said heat spreader by mounting screws.

8. The printed circuit board assembly as defined in claim 7, and further including a fluid and a wick inside side heat pipe.

9. The printed circuit board assembly of claim 1, wherein said condenser section includes a finned structure.

10. The printed circuit board assembly of claim 1, wherein said pedestal is shaped to correspond to said chip and said mounting pad has a base portion which is shaped to correspond to said base of said plate of said heat spreader.

11. A printed circuit board assembly comprising:

a. a printed circuit board having a top side, a bottom side and an opening extending from said top side through said bottom side, b. a plurality of pads on said printed circuit board, c. a rectangular heat pipe mounted on the bottom side of said printed circuit board, said rectangular heat pipe having an elongated evaporator section and a condenser section, said elongated evaporator section having a side wall, a pedestal integrally formed along the side wall which extends up into said opening, and d. a high density TAB IC chip mounted on top of said pedestal, said high density TAB IC chip having a plurality of leads coupled to said pads on said printed circuit board.

* * * * *